United States Patent
Huang et al.

(10) Patent No.: US 9,902,092 B2
(45) Date of Patent: Feb. 27, 2018

(54) VACUUM CARRIER MODULE, METHOD OF USING AND PROCESS OF MAKING THE SAME

(71) Applicant: TAIWAN SEMICONDUCTOR MANUFACTURING COMPANY, LTD., Hsinchu (TW)

(72) Inventors: Tien-Yu Huang, Shuishan Township (TW); Chun-Hao Tseng, Taichung (TW); Ying-Hao Kuo, Hsinchu (TW); Kuo-Chung Yee, Taoyuan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 428 days.

(21) Appl. No.: 14/089,811

(22) Filed: Nov. 26, 2013

(65) Prior Publication Data

US 2015/0147852 A1    May 28, 2015

(51) Int. Cl.

| | |
|---|---|
| *H01L 21/67* | (2006.01) |
| *H01L 21/673* | (2006.01) |
| *B29C 33/38* | (2006.01) |
| *B29C 41/38* | (2006.01) |
| *B29C 41/50* | (2006.01) |
| *B29C 41/42* | (2006.01) |
| *H01L 21/56* | (2006.01) |
| *B29C 41/20* | (2006.01) |

(Continued)

(52) U.S. Cl.
CPC .......... *B29C 33/3842* (2013.01); *B29C 41/20* (2013.01); *B29C 41/38* (2013.01); *B29C 41/42* (2013.01); *B29C 41/50* (2013.01); *B29C 45/14016* (2013.01); *B29C 45/14655* (2013.01); *H01L 21/56* (2013.01); *B29K 2867/00* (2013.01); *B29L 2031/3481* (2013.01); *H01L 24/96* (2013.01); *Y10T 156/1056* (2015.01)

(58) Field of Classification Search
CPC . H01L 21/6838; H01L 21/6875; H01L 21/56; H01L 24/96; B29C 33/3842; B29C 41/20; B29C 41/38; B29C 41/42; B29C 41/50; B29C 45/14016; B29C 45/14655; B29K 2867/00; B29L 2031/3481; Y10T 156/1056
USPC ....... 269/21, 22; 156/252; 425/437; 438/127
See application file for complete search history.

(56) References Cited

U.S. PATENT DOCUMENTS 4,778,326 A * 10/1988 Althouse ........... H01L 21/67132
                                                              206/471
5,524,765 A *  6/1996 Gutentag ............ H05K 13/0084
                                                              206/713

(Continued)

*Primary Examiner* — Marc Carlson
(74) *Attorney, Agent, or Firm* — Slater Matsil, LLP (57) ABSTRACT

A vacuum carrier module includes a substrate having at least one hole and an edge region. There is at least one support on a top surface of the substrate. Further, a gel film is adhered to the edge region of the substrate. The at least one hole fluidly connects a reservoir located above the top surface of the substrate. A method of using a vacuum carrier module includes planarizing a gel film by passing an alignment material through a hole in a substrate to contact a first surface of the gel film, positioning at least one chip on a second surface of the gel film opposite the first surface. The method further includes encasing the at least one chip in a molding material and applying a vacuum to the first surface of the gel film.

19 Claims, 5 Drawing Sheets

(51) Int. Cl.
*B29C 45/14* (2006.01)
*B29L 31/34* (2006.01)
*H01L 23/00* (2006.01)

(56) References Cited

U.S. PATENT DOCUMENTS

| | | | | |
|---|---|---|---|---|
| 6,136,137 A * | 10/2000 | Farnworth | ............ | B28D 5/0094 |
| | | | | 156/701 |
| 6,751,853 B2 * | 6/2004 | Farnworth | ............ | B25B 11/005 |
| | | | | 269/21 |
| 7,632,374 B2 * | 12/2009 | Ozono | .............. | H01L 21/67132 |
| | | | | 156/64 |

* cited by examiner

VACUUM CARRIER MODULE, METHOD OF USING AND PROCESS OF MAKING THE SAME

BACKGROUND

Manufacturing a semiconductor device includes forming chips. Chips which support a functionality of the semiconductor device are encased in a common molding material. The chips are bonded to a carrier using a release film. The molding material surrounds the chips. The combined molding material and chips are then separated from the carrier by processing the release film.

Examples of processing the release film include thermal release and ultraviolet (UV) release. In thermal release processes, the release film is heated to a temperature sufficient to reduce an adhesive strength of the release film and the molding material and chips are peeled off the film.

In UV release processes, the release film is exposed to UV radiation in order to reduce the adhesive strength of the release film. In order for UV radiation to reach the release film, the carrier on which the release film is placed is transparent to UV radiation.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting. The making and using of illustrative embodiments are discussed in detail below. It should be appreciated; however, that the disclosure provides many applicable inventive concepts that can be embodied in a wide variety of specific contexts. In at least some embodiments, one or more embodiment(s) detailed herein and/or variations thereof are combinable with one or more embodiment(s) herein and/or variations thereof.

Figure 1A:
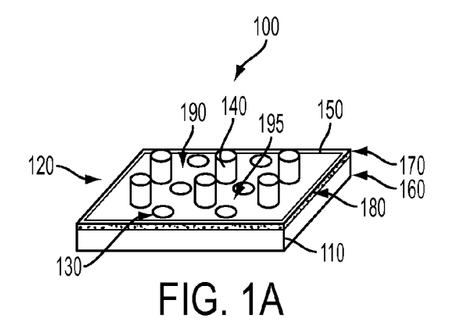
FIG. 1A is a perspective view of a vacuum carrier module in accordance with some embodiments.

FIG. 1A is a perspective view of vacuum carrier module 100. Vacuum carrier module 100 includes a substrate 110. Vacuum carrier module 100 further includes an edge region 120 around a periphery of substrate 110. Vacuum carrier module 100 further includes holes 130 extending through substrate 110 and supports 140 over the substrate. A gel film 150 extends over supports 140 and is attached at edge region 120. Holes 130 extend from a bottom surface 160 of substrate 110 to a top surface 170 of the substrate. Edge region 120 is a perimeter portion of top surface 170. An adhesive material 180 binds gel film 150 to edge region 120. A reservoir 190 is located between gel film 150 and top surface 170. An outer edge of reservoir 190 is defined by edge region 120. Holes 130 are in fluid communication with reservoir 190. Supports 140 are located in a center portion 195 of substrate 110 to separate gel film 150 from the top surface 170 of the substrate 110.

Figure 1B:
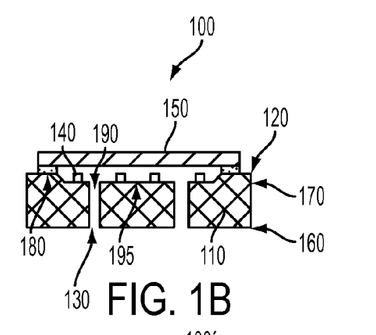
FIG. 1B is a cross-sectional view of a vacuum carrier module in accordance with FIG. 1A.

FIG. 1B is a cross-sectional view of vacuum carrier module 100 in accordance with FIG. 1A. Vacuum carrier 110 includes edge region 120 which is raised with respect to center portion 195. Adhesive material 180 is over an entirety of a top surface of edge region 120. Adhesive material 180 binds gel film 150 to edge region 120. Supports 140 are located in center portion 195 of substrate 110 to separate gel film 150 from top surface 170 of substrate 110. Gel film 150 and top surface 170 form reservoir 190 in fluid communication with holes 130. Edge region 120 defines the outer edge of reservoir 190.

Substrate 110 is used to support gel film 150 and to help define reservoir 190 for receiving an alignment material. In some embodiments, the alignment material is passed through the holes 130 into reservoir 190. In some embodiments, the alignment material includes at least one of compressed dry air (CDA), $N_2$, other inert gases, silicone oil, or other suitable fluids. In some embodiments, substrate 110 is a silicon carbide (SiC) substrate, sapphire substrate, a silicon substrate, or another suitable substrate. In some embodiments, substrate 110 includes a glass, metal, ceramic, or organic wafer. In some embodiments, substrate 110 is circular, rectangular, or other suitable shape.

An edge region 120 is defined along a periphery of the top surface 170 of the substrate 110. In some embodiments, edge region 120 helps to define reservoir 190. In some embodiments, the edge region 120 is a location where the gel film 150 is secured to substrate 110. In some embodiments, edge region 120 is a continuous structure around the periphery of top surface 170. In some embodiments, edge region 120 is a discontinuous structure around the periphery of top surface 170. In some embodiments, the edge region 120 is substantially planar with a center portion 195 of substrate 110. In some embodiments, edge region 120 is raised with respect to the center portion of substrate 110. In some embodiments, at least one support 140 is formed on the edge region 120, as shown in FIG. 1D.

Hole 130 extends from the bottom surface 160 of substrate 110 to the top surface 170 of substrate 110 into reservoir 190 to facilitate the alignment material contacting the portion of the gel film 150 facing the top surface of the substrate 110. In some embodiments, substrate 110 comprises a single hole 130. In some embodiments, a plurality of holes 130 is in substrate 110. In some embodiments, the plurality of holes 130 is arranged in a regular pattern across substrate 110. In some embodiments, the plurality of holes 130 is arranged randomly across substrate 110. In some embodiments, substrate 110 includes a higher concentration of holes 130 near the center portion of the substrate. In other embodiments, at least one hole 130 is located in edge region 120.

Support 140 is used to separate gel film 150 from the top surface 170 of substrate 110 in the center portion of the substrate. In some embodiments, at least one support 140 is located in the center portion of the substrate 110. In some embodiments, there is more than one support 140. In some embodiments, at least one support 140 is located in edge region 120. In some embodiments, support 140 extends above a top surface of edge region 120. In some embodiments, the top surface of edge region 120 extends above support 140. In some embodiments, a top surface of support 140 is substantially level with the top surface of edge region 120. In some embodiments, each support 140 has a same height. In some embodiments, at least one support 140 has a different height from at least another support 140.

Figure 1C:
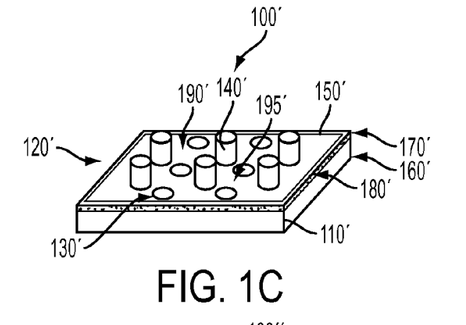
FIG. 1C is a perspective view of a vacuum carrier module in accordance with some embodiments.
Figure 1D:
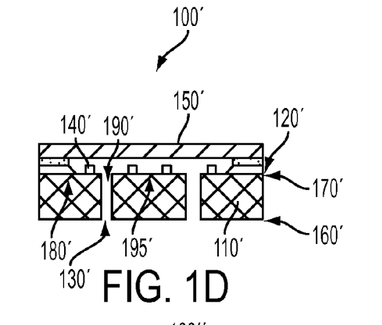
FIG. 1D is a cross-sectional view of a vacuum carrier module in accordance with FIG. 1C.

FIG. 1C is a perspective view of a vacuum carrier module 100' in accordance with some embodiments. FIG. 1D is a cross-sectional view of vacuum carrier module 100' in accordance with some embodiments. Vacuum carrier module 100' is similar to vacuum carrier module 100 (FIG. 1A). In comparison with vacuum carrier module 100, vacuum carrier module 100' includes a support 140' over an edge region 120'. An adhesive material 180' is over a top surface of support 140' over edge region 120'. In some embodiments, a height of support 140' over edge region 120' is equal to a height of supports 140' in a center portion 195' of a substrate 110'. In some embodiments, the height of support 140' over edge region 120' is less than a height of at least one support 140' in center portion 195'. In some embodiments, the height of support 140' over edge region 120' is greater than a height of at least one support 140' in center portion 195'.

Figure 1E:
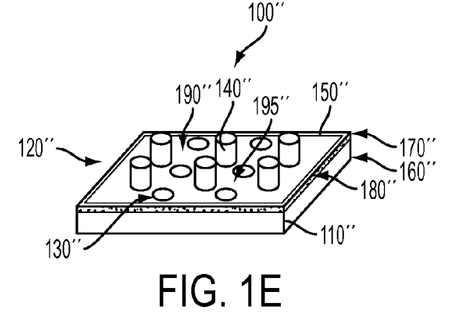
FIG. 1E is perspective view of a vacuum carrier module in accordance with some embodiments.
Figure 1F:
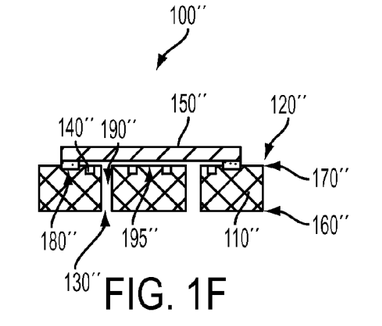
FIG. 1F is a cross-sectional view of a vacuum carrier module in accordance with FIG. 1E.

FIG. 1E is a perspective view of a vacuum carrier module 100" in accordance with some embodiments. FIG. 1F is a cross-sectional view of vacuum carrier module 100" in accordance with some embodiments. Vacuum carrier module 100" is similar to vacuum carrier module 100 (FIG. 1A). In comparison with vacuum carrier module 100, vacuum carrier module 100" includes a support 140" over a center portion of the substrate 110". An adhesive material 180" is over an edge region 120". In some embodiments, a height of support 140" over a center portion of the substrate 110" extends above the edge region.

Figure 2:
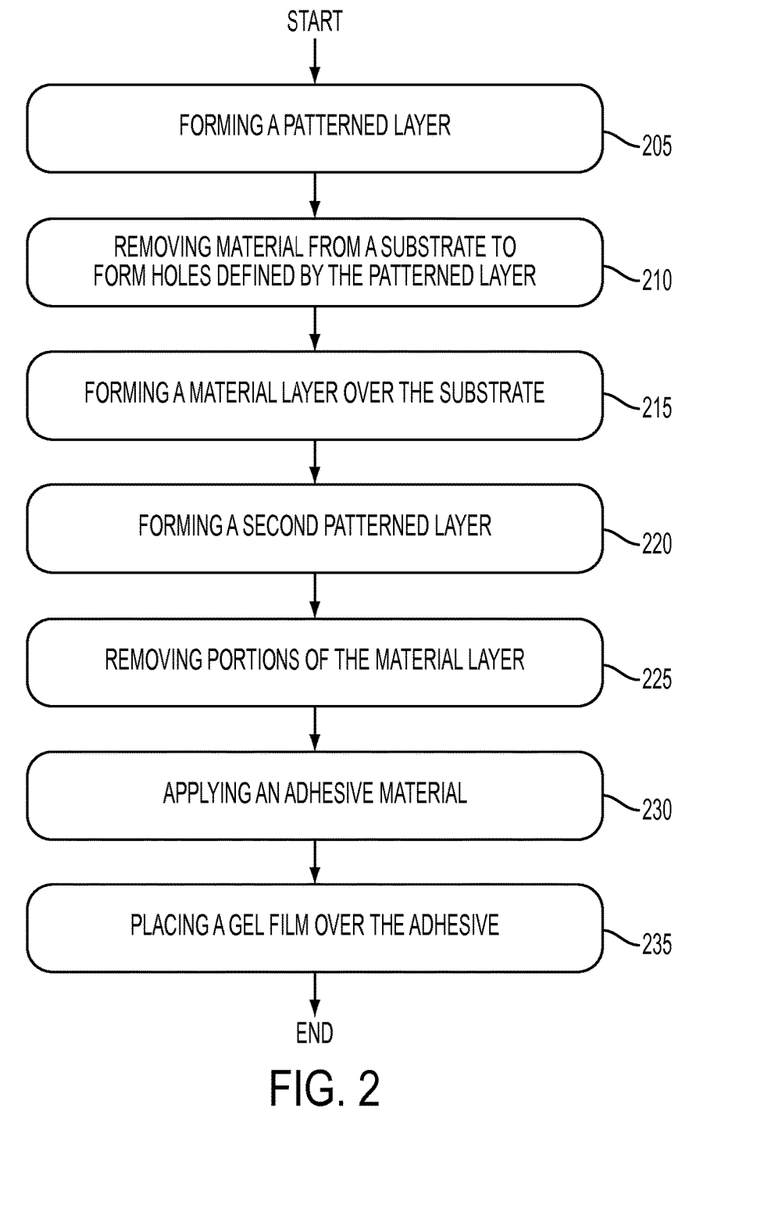
FIG. 2 is a flow chart of a method of manufacturing a vacuum carrier module in accordance with some embodiments.
Figure 3A:
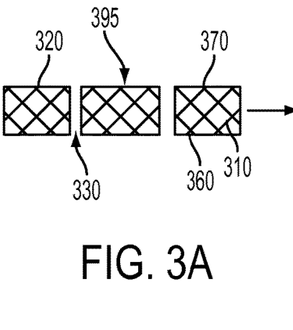
FIGS. 3A-3C are cross-sectional views of a vacuum carrier module at various stages during manufacture in accordance with some embodiments.
Figure 3B:
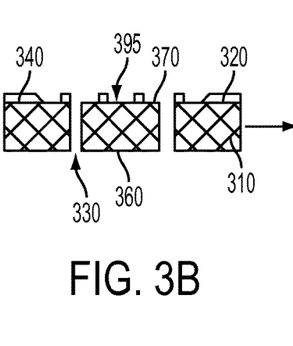
Figure 3C:
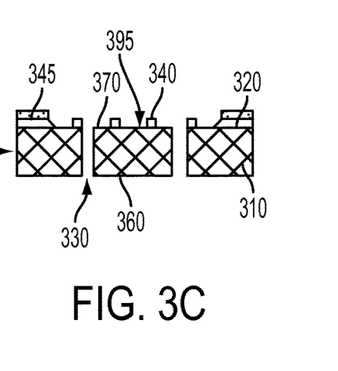

FIG. 2 is a flow chart of a method 200 of manufacturing a substrate in accordance with some embodiments. FIGS. 3A-3C are cross-sectional views of a substrate at various stages during manufacture in accordance with some embodiments.

Method 200 begins with an operation 205 in which a first patterned layer is formed on a substrate. In some embodiments, holes defined by the patterned layer are formed by photolithography, immersion lithography, or other suitable patterning processes. For example, in some embodiments, the patterned layer is formed by blanket depositing a photoresist on the substrate. In some embodiments, the photoresist is deposited using spin-on coating, physical vapor deposition (PVD), sputtering, or another suitable deposition process. The photoresist layer is patterned using a combination of photolithography to define a pattern and baking to develop the pattern in the photoresist. In some embodiments, the photoresist is a positive photoresist. In some embodiments, the photoresist is a negative photoresist. The patterned layer includes a single layer or a multiple layer structure.

Method 200 continues with a process 210 in which, a material removing process 210 is applied to the substrate to remove the substrate material the holes defined by the patterned layer. In some embodiments, the material removing process includes at least one of wet etching, dry etching, laser drilling, or other suitable material removal processes. In some embodiments, the laser drilling uses a laser having a wavelength of about 355 nanometer (nm) or less. In some embodiments, the laser source is a neodymium-doped yttrium aluminum garnet (Nd:YAG) laser source. In some embodiments, the source power of the laser drilling is about 10.8 Watts or more. In some embodiments, the laser drilling has a repetition rate of about 100 KHz and a pulse duration ranging from about 20 ns to about 75 ns. In some embodiments, the wet etching is performed using an etchant which includes a solvent or a chemical. In some embodiments, the solvent includes N-Methyl-2-pyrrolidone (NMP), Propylene Glycol Monomethyl Ether (PGME), Propylene Glycol Methyl Ether Acetate (PGMEA), water, or Dimethyl sulfoxide (DMSO), in various applications. In some embodiments, the chemical includes acid, base, oxidant, reductant, or surfactant. In some embodiments, the acid includes HCl, $H_2SO_4$, $HNO_3$, HF, or phosphoric acid. In some embodiments, the base includes ammonia or Tetramethylammonium hydroxide (TMAH) a or another suitable base. In some embodiments, the oxidant includes $H_2O_2$, $HNO_3$, or $O_3$. In some embodiments, the surfactant includes polyethene oxide, polypropylene oxide, polybutylenes oxide, or polypentylene oxide, and fluoroalkylsulfonate such as PFOS. In some embodiments, the dry etching is performed using an etchant which includes acids, such as hydrochloric acid, acetic acid, citric acid, tartaric acid, oxalic acid, etc.; acidic metal salts such as ferric chloride, cupric chloride, cadmium chloride, magnesium chloride, zinc chloride, ferric nitrate, etc.; strong bases, such as sodium hydroxide, potassium hydroxide; oxidizing agents, such as sodium persulfate, sodium perborate; potassium bichro mate, sodium peroxide, etc.

FIG. 3A is a cross-sectional view of the vacuum carrier module following operation 210. The vacuum carrier module of FIG. 3A is similar to vacuum carrier module 100 (FIG. 1A). Similar elements in the vacuum carrier module of FIG. 3A have a same reference number as in FIG. 1A increased by 200. FIG. 3A includes holes 330 formed by the material removing process. In some embodiments, the vacuum carrier module of FIG. 3A includes a single hole 330. Holes 330 have a circular shape. In some embodiments, holes 330 have a rectangular shape or other suitable shape.

Returning to FIG. 2, method 200 continues with operation 215 in which a material layer is formed over the substrate. In some embodiments, the material layer includes silicon, glass-silicon, metal, ceramic, organic, polymer or other suitable materials. In some embodiments, the material layer is formed using techniques such as atomic layer deposition (ALD), physical vapor deposition (PVD), sputtering, chemical vapor deposition (CVD) or other suitable formation techniques.

Method 200 continues with operation 220 in which a second patterned layer is formed on the material layer. The second patterned layer is similar to the first patterned layer discussed above. In some embodiments, the second patterned layer is formed by photolithography, immersion lithography, or other suitable process. In some embodiments, the second patterned layer is formed using a same process as the first patterned layer. In some embodiments, the second patterned layer is formed using a different process from the first patterned layer.

Method 200 continues with operation 225 in which a material removing process is applied to the material layer to remove portions of the material layer. The portions of the material layer are removed through openings defined by the second patterned layer. In some embodiments, the portions of the material layer are removed using wet etching, dry etching, or other suitable material removal processes. In some embodiments, the material removal process in operation 225 is a same material removal process as in operation 210. In some embodiments, the material removal process in operation 225 is different from the material removal process in operation 210.

FIG. 3B is a cross-sectional view of the vacuum carrier module following operation 225. In comparison with FIG. 3A, FIG. 3B includes supports 340 on top surface 370 of substrate 310 in the center portion 395 of the substrate. Supports 340 are defined by the remaining portions of the material layer on the substrate 310 following the material removal process in operation 225. In some embodiments, at least one support 340 is located in the center portion 395 of the substrate 310. In some embodiments, there is more than one support 340. In some embodiments, at least one support 340 is located in edge region 320. In some embodiments, at least one support 340 extends above a top surface 370 of edge region 320. In some embodiments, top surface 370 of edge region 320 extends above at least one support 340. In some embodiments, a top surface of support 340 is substantially coplanar with a top surface of edge region 320.

Support 340 is used to separate a gel film from the top surface 370 of substrate 310 in the center portion of the substrate. In some embodiments, at least one support 340 is located in the center portion of the substrate 310. In some embodiments, there is more than one support 340. In some embodiments, at least one support 340 is located in edge region 320. In some embodiments, support 340 extends above a top surface of edge region 320. In some embodiments, the top surface of edge region 320 extends above support 340. In some embodiments, a top surface of support 340 is substantially level with the top surface of edge region 320. In some embodiments, each support 340 has a same height. In some embodiments, at least one support 340 has a different height from at least another support 340.

Returning to FIG. 2, method 200 continues with operation 230 in which an adhesive material is applied to at least a portion of an edge region. In some embodiments, the adhesive material is applied on at least two locations of the edge region. In some embodiments, the adhesive material is applied on an entirety of the edge region of the substrate. In some embodiments, the adhesive material is applied on less than the entirety of the edge region of the substrate. In some embodiments, the adhesive material is applied on all raised or flat edge regions of the carrier. In some embodiments, the adhesive material is applied on less than all edges that are either raised or flat. In some embodiments, the adhesive material is applied to at least one support formed by the material layer. In some embodiments, the adhesive material includes a polymer composite, an epoxy, or other suitable adhesive material.

FIG. 3C is a cross-sectional view of the vacuum carrier module following operation 230. In comparison with FIG. 3B, FIG. 3C includes an adhesive material 345 on the top surface of support 340 located in edge region 320. In some embodiments, adhesive material 345 is directly on substrate 310 in edge region 320. In some embodiments, adhesive material 345 is continuously formed along an entirety to edge region 320. In some embodiments, adhesive material 345 is selectively deposited along portions of edge region 320. In some embodiments, adhesive material 345 is deposited on at least one support 340 in a center portion of substrate 310.

Returning to FIG. 2, method 200 continues with operation 235 in which a gel film is attached to the adhesive material. In some embodiments, the gel film is of any suitable shape or size. In some embodiments, the gel film comprises silicone or polymer based compounds. In some embodiments, the gel film comprises WF Film® made by Gel-Pak. Following operation 235, the vacuum carrier module resembles vacuum carrier module 100 (FIG. 1D), in some embodiments.

One of ordinary skill in the art would recognize that operations are added or removed from method 200, in some embodiments. One of ordinary skill in the art would also recognize that an order of operations in method 200 is able to be changed, in some embodiments.

Figure 4:
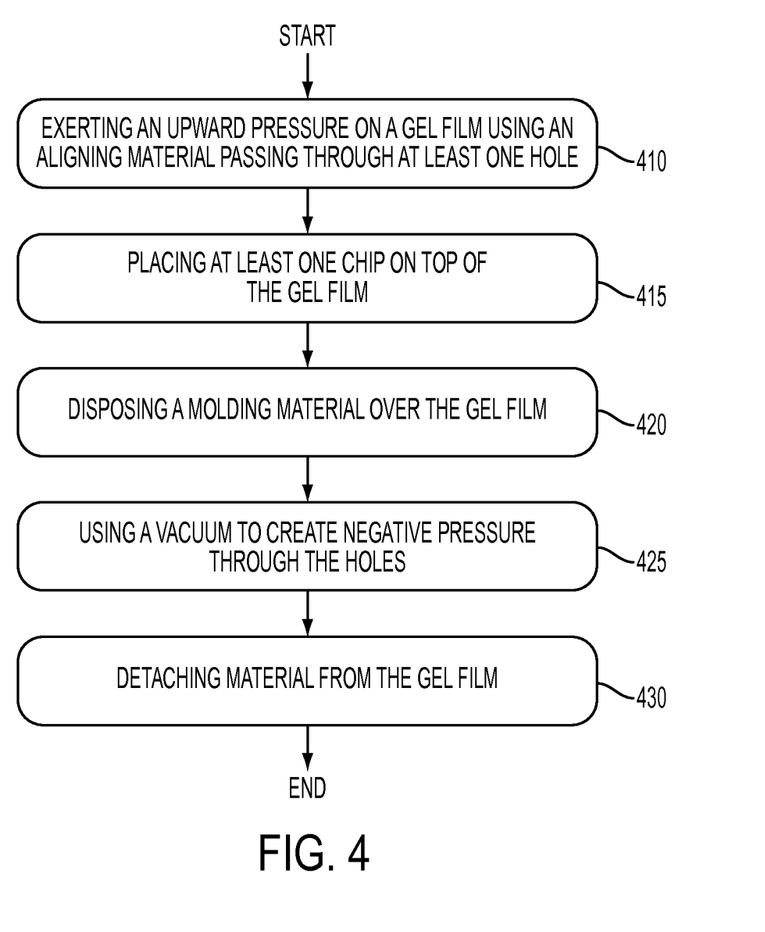
FIG. 4 is a flow chart of a method of using a vacuum carrier module in accordance with some embodiments.
Figure 5A:
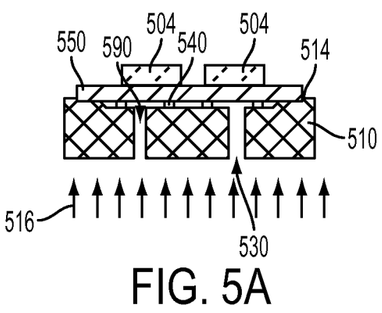
FIGS. 5A-5D are cross-sectional views of a vacuum carrier module at various stages during use of the vacuum carrier module in accordance with some embodiments.

FIG. 4 is a flow chart of a method 400 of using a vacuum carrier module in accordance with some embodiments and FIGS. 5A-5 D are schematic cross-sectional views of a vacuum carrier module at various stages during a method of use in accordance with some embodiments.

Referring to FIG. 4, in operation 410 an upward pressure is exerted on a gel film by an aligning material through the hole(s). In some embodiments, such upward pressure is exerted by passing the alignment material through the hole(s) to help ensure that the gel film remains planar. In some embodiments, such pressure is exerted using a pressure exerting tool. In some embodiments, the pressure exerting tool comprises a pump, a compressor or other suitable pressurizing tools. In some embodiments, an amount of pressure exerted is controlled using a control system. In some embodiments, the control system is configured to selectively activate the pressure exerting tool. In some embodiments, the control system is configured to monitor the pressure exerted using pressure sensors located outside of the vacuum carrier module. In some embodiments, the control system is configured to adjust the amount of pressure exerted in response to a weight applied to a top surface of the gel film. The aligning material comprises materials which are not reactive with the gel film. The alignment material does not reach a phase transition temperature at a temperature at which a molding material is placed on top of the gel film. In some embodiments, the alignment material comprises compressed dry air (CDA), $N_2$, other inert gases, silicone oil, or other suitable fluids. An upward pressure exerted by the aligning material from a bottom portion through the top portion of the hole(s) help(s) the gel film in being planar with respect to the substrate. The upward pressure exerted by the aligning material is lower than an adhesive strength between the gel film and the substrate so that the gel film remains fixed on top of the substrate.

In operation 415 at least one chip is placed on top of the gel film. In some embodiments, the upward pressure of the aligning material is increased to compensate for an increased downward force resulting from a weight of the chips on the gel film. In some embodiments, the upward pressure of the aligning material remains constant. Further, in some embodiments, the upward pressure of the aligning material is continuous throughout until the molding material is cured.

FIG. 5A is a cross-sectional view of the vacuum carrier module following operation 415. FIG. 5A includes a vacuum carrier module similar to vacuum carrier module 100 (FIG. 1A). Similar elements have a same reference number increased by 400. Two chips 504 are located on gel film 550. In some embodiments, one chip 504 is placed on gel film 550. In some embodiments, more than two chips 504 are placed on gel film 550. An alignment material 516 is applied to a reservoir 590 through holes 530 in substrate 510.

Returning to FIG. 4, in operation 420 a molding material 506 is disposed over the gel film 550 and cured. In some embodiments, a two-step molding process is used wherein a separate underfill material is first injected beneath the gel film and the substrate followed by over-molding with a second molding material to encapsulate and fill spaces between the gel film and the substrate. The underfill material is any suitable liquid epoxy, deformable gel, silicone rubber, or other suitable material used for underfilling compounds. In some embodiments, the process used is any suitable method known in the art, such as spinning, chemical vapor deposition (CVD) and plasma enhanced chemical vapor deposition (PECVD). In some embodiments, the molding material is cured using heat or ultraviolet (UV) radiation for a period of time sufficient to harden the molding material. In some embodiments, the upward pressure of the aligning material remains constant during operation 420. Further, in some embodiments, the upward pressure of the aligning material is continuous from the previous process until the molding material is cured, while in additional embodiments, the upward pressure of the aligning material is stopped for a period of time after the at least one chip is placed on top of the gel film and before the molding material is placed on top of the gel film.

Figure 5B:
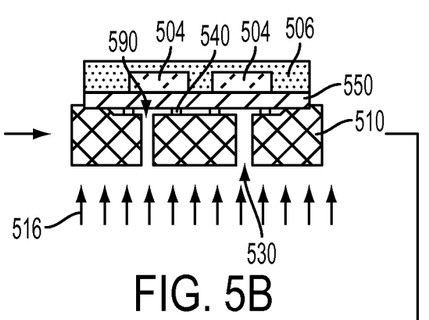

FIG. 5B is a cross-sectional view of the vacuum carrier module following operation 420. In comparison with FIG. 5A, FIG. 5B includes a molding material 506 disposed over the chips 504 and on top of the gel film 550.

Returning to FIG. 4, in operation 425 a negative pressure or a vacuum is created through the hole(s) of the substrate to detach the gel film from the molding material. Such negative pressure or a vacuum has a sufficient magnitude to detach the gel film from the cured molding material. In some embodiments, the negative pressure or a vacuum which is created through the hole(s) is continuous from after the molding material is cured up until the molding material is detached in operation 430. In some embodiments, the negative pressure or the vacuum is generated using a pump, or another suitable pressure inducing tool. In some embodiments, a control system is used in generating adequate negative pressure. In some embodiments, the control system is used to regulate a magnitude of the negative pressure or the vacuum.

Figure 5C:
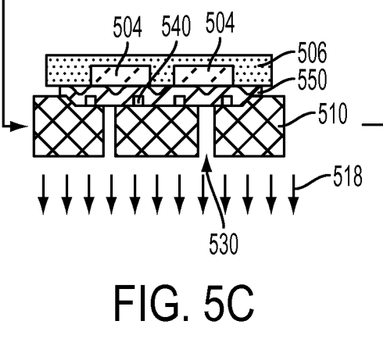

FIG. 5C is a cross-sectional view of the vacuum carrier module following operation 425. In comparison with FIG. 5B, FIG. 5C includes a vacuum 518 exerted on the gel film 550 through the holes 530 at the bottom portion of the substrate 510. Vacuum 518 results in reduced surface area between the gel film 550 and molding material 506. The pressure also results in the gel film 550 not being planar. Supports 540 help to prevent gel film 550 from being pulled into holes 530 by vacuum 518 to reduce a risk of damage to the gel film.

Referring to FIG. 4, method 400 continues with operation 430 in which the molding material is detached from the gel film. In some embodiments, the molding material is peeled off. In some embodiments, the molding material is removed. After the detachment of the molding material from the gel film, gel film 550 retains a shape such that the gel film is planar in accordance with the carrier substrate due to the inherent elasticity of the gel film. The gel film is then reused by placing additional chip(s) and method 400 is repeated.

Figure 5D:
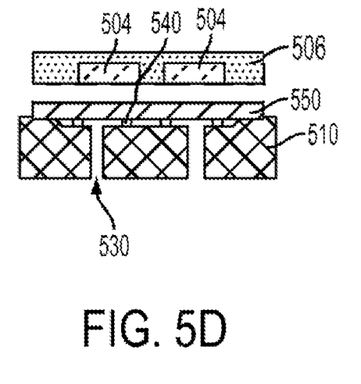

FIG. 5D is a cross-sectional view of the vacuum carrier module following operation 430. In comparison with FIG. 5C, FIG. 5D includes the gel film 550 returned to the original shape and the molding material 506 being separated from the gel film. In some embodiments, the molding material 506 is removed.

Various embodiments of the present disclosure involve methods to prevent chips 504 and/or the molding material 506 from collecting residue after a molding process. As previously discussed, a gel film 550 is used on substrate 510 during the molding process. The gel film has an elastic property that allows such gel film to be reusable. While molding material 506 is in contact with the gel film 550, a non-adhesive nature of such contact combined with the vacuum release, as in FIG. 5C, helps to prevent residue from the gel film from being left behind on the molding material and/or any other part of the chip(s).

One aspect of this description relates to a vacuum carrier module. The vacuum carrier module includes a substrate having at least one hole and an edge region. There is at least one support on a top surface of the substrate. Further, a gel film is adhered to the edge region of the substrate. The at least one hole fluidly connects a reservoir located above the top surface of the substrate.

Another aspect of this description relates to a method of using a vacuum carrier module. The method includes planarizing a gel film by passing an alignment material through a hole in a substrate to contact a first surface of the gel film, positioning at least one chip on a second surface of the gel film opposite the first surface. The method further includes encasing the at least one chip in a molding material and applying a vacuum to the first surface of the gel film.

Still another aspect of this description relates to a method of making vacuum carrier module. The method including forming at least one hole in a substrate, forming at least one support on a top surface of the substrate, and fixing a gel film to an edge region of the substrate. The gel film is positioned over the at least one support.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A vacuum carrier module comprising:
   a substrate comprising a bottom surface, a top surface, and an edge region, the edge region being disposed around a periphery of the substrate and protruding above the top surface;
   a plurality of fluid passageways extending through the substrate from the top surface to the bottom surface;

a gel film comprising a first surface adhered to the edge region of the substrate and a second surface for supporting a chip, wherein the first surface of the gel film and the top surface of the substrate form a reservoir in fluid communication with the plurality of fluid passageways, and wherein the reservoir is configured to receive and contain an aligning material under positive pressure to planarize the gel film; and a plurality of supports located on the top surface and protruding above the top surface of the substrate, the plurality of supports each having an uppermost supporting surface spaced from the top surface by a distance, wherein the uppermost supporting surface with a largest distance from the top surface is physically spaced apart from the first surface of the gel film when the gel film is planar, and wherein each of the uppermost supporting surface make direct contact with the first surface of the gel film when the reservoir is under negative pressure.

2. The vacuum carrier module of claim 1, wherein the reservoir is configured to receive an alignment material, the alignment material comprises at least one of Compressed Dry Air (CDA), Nitrogen, or silicone oil.

3. The vacuum carrier module of claim 1, wherein the substrate has a center portion and a top surface of the edge region that is raised with respect to a top surface of the center portion or the top surface of the edge region is flat with respect to the top surface of the center portion.

4. The vacuum carrier module of claim 1, wherein the plurality of supports comprise a second support located on the edge region of the substrate.

5. The vacuum carrier module of claim 4, wherein the gel film is adhered to the second support.

6. The vacuum carrier module of claim 1, wherein the gel film comprises at least one of a silicone based compound or a polymer based compound.

7. The vacuum carrier module of claim 1, wherein the plurality of supports have an upper surface parallel to the top surface of the substrate, wherein the upper surface extends above a top surface of the edge region of the substrate.

8. The vacuum carrier module of claim 1, wherein the plurality of supports have an upper surface parallel to the top surface of the substrate, wherein the upper surface is lower than a top surface of the edge region of the substrate.

9. The vacuum carrier module of claim 1, further comprising an adhesive material between the gel film and an entirety of the edge region of the substrate.

10. The vacuum carrier module of claim 9, wherein the adhesive material comprises a polymer composite.

11. A method of making a vacuum carrier module, the method comprising:
forming at least one hole in a substrate;
forming at least one support on a top surface of the substrate, wherein forming the at least one support on the top surface of the substrate comprises:
depositing a support material on the top surface of the substrate, the support material being different than a material of the substrate; and
etching the support material to define the at least one support; and
fixing a gel film to an edge region of the substrate using a polymer composite or an epoxy adhesive, wherein the gel film is positioned over the at least one support.

12. The method of claim 11, wherein fixing the gel film to the substrate further comprises:
applying the epoxy adhesive to the at least one support; and
after applying the epoxy adhesive to the at least one support, disposing the gel film on the epoxy adhesive.

13. The method of claim 11, wherein forming the least one hole in the substrate further comprises extending the hole from a bottom surface of the substrate to the top surface of the substrate.

14. The method of claim 11, wherein forming the at least one support on the top surface of the substrate further comprises forming the at least one support on the edge region of the substrate.

15. A vacuum carrier module comprising:
a substrate having a top surface with a center region and an edge region on a peripheral portion of the top surface around the center region;
at least one hole extending through the center region of the top surface to a bottom surface of the substrate;
at least one support formed on top of the center region of the top surface and at least one second support formed on top of the edge region of the top surface, the at least one second support having a first upper surface higher than the top surface and comprising a different material than the substrate; and
an adhesive binding a gel film to the first upper surface of the at least one second support, wherein the gel film, the at least one second support, and the top surface form a reservoir in fluid communication with the at least one hole, and wherein the reservoir is configured to receive and contain an aligning material under positive pressure to planarize the gel film.

16. The vacuum carrier module of claim 15, wherein the at least one support has a second upper surface substantially co-planar with the first upper surface.

17. The vacuum carrier module of claim 15, wherein the at least one support has a second upper surface parallel to the top surface of the substrate, and extending above the first upper surface, wherein the second upper surface is substantially level across an entirety of the at least one support.

18. The vacuum carrier module of claim 15, wherein the at least one support has a second upper surface parallel to the top surface of the substrate, and lower than the first upper surface, wherein the second upper surface is substantially level across an entirety of the at least one support.

19. The vacuum carrier module of claim 15, further comprising an adhesive material between the gel film and the first upper surface of the edge region.

\* \* \* \* \*